United States Patent
Loprieno et al.

(10) Patent No.: US 10,404,402 B2
(45) Date of Patent: Sep. 3, 2019

(54) SECURITY PROTECTION OF TERABIT ETHERNET PCS LAYER USING ALIGNMENT MARKERS

(71) Applicant: Cisco Technology, Inc., San Jose, CA (US)

(72) Inventors: Gilberto Loprieno, Milan (IT); Emanuele Umberto Giacometti, Ciriè (IT); Davide Codella, Mariano Comense (IT)

(73) Assignee: Cisco Technology, Inc., San Jose, CA (US)

( * ) Notice: Subject to any disclaimer, the term of this patent is extended or adjusted under 35 U.S.C. 154(b) by 132 days.

(21) Appl. No.: 15/712,385

(22) Filed: Sep. 22, 2017

(65) Prior Publication Data

US 2019/0097748 A1    Mar. 28, 2019

(51) Int. Cl.
| | |
|---|---|
| *H04L 1/00* | (2006.01) |
| *H04J 14/02* | (2006.01) |
| *H04B 10/61* | (2013.01) |
| *H03M 13/33* | (2006.01) |
| *H03M 13/03* | (2006.01) |

(52) U.S. Cl.
CPC ....... *H04J 14/0293* (2013.01); *H03M 13/333* (2013.01); *H04B 10/6166* (2013.01); *H03M 13/03* (2013.01); *H04L 1/004* (2013.01)

(58) Field of Classification Search
CPC .............. H04J 14/0293; H03M 13/333; H04B 10/6166
See application file for complete search history.

(56) References Cited

U.S. PATENT DOCUMENTS

| | | |
|---|---|---|
| 2014/0092918 A1 | 4/2014 | Jost |
| 2016/0087753 A1 | 3/2016 | Ran et al. |
| 2017/0171163 A1 | 6/2017 | Gareau et al. |

OTHER PUBLICATIONS

"119. Physical Coding Sublayer (PCS) for 64B/66B, type 200GBASE-R and 400GBASE-R", IEEE Draft P802.3bs/D1.4, Apr. 7, 2016, Draft Amendment to IEEE Std 802.3-2015, IEEE P802.3bs 400 Gb/s Ethernet Task Force, 40 pages.

*Primary Examiner* — Oleg Korsak
(74) *Attorney, Agent, or Firm* — Edell, Shapiro & Finnan, LLC (57) ABSTRACT

A method generates, from an input data stream, multiple lanes of a physical coding sublayer (PCS) signal. The method converts the data stream to a sequence of bit blocks, and periodically inserts into the sequence of bit blocks an alignment marker (AM) group including multiple individual alignment markers for respective ones of the multiple lanes. The method adds security protection to each bit block according to a security protocol to produce a sequence of protected bit blocks, and modifies each AM group with security information to be used by the security protocol to remove the security protection added to the sequence of protected bit blocks. The method applies forward error correction to the sequence of protected bit blocks and the modified AM groups to produce forward error correction codewords, and produces the multiple lanes from the codewords. The method transmits the multiple lanes over an optical link.

20 Claims, 13 Drawing Sheets

400GBASE-R ALIGNMENT MARKER ENCODINGS (FOR AM GROUP)

| PCS LANE NUMBER | ENCODING* {CM0, CM1, CM2, UP0, CM3, CM4, CM5, UP1, UM0, UM1, UM2, UP2, UM3, UM4, UM5} |
|---|---|
| 0 | 0x9A, 0x4A, 0x26, 0xB6, 0x65, 0xB5, 0xD9, 0xD9, 0x01, 0x71, 0xF3, 0x26, 0xFE, 0x8E, 0x0C |
| 1 | 0x9A, 0x4A, 0x26, 0x04, 0x65, 0xB5, 0xD9, 0x67, 0x5A, 0xDE, 0x7E, 0x98, 0xA5, 0x21, 0x81 |
| 2 | 0x9A, 0x4A, 0x26, 0x46, 0x65, 0xB5, 0xD9, 0xFE, 0x3E, 0xF3, 0x56, 0x01, 0xC1, 0x0C, 0xA9 |
| 3 | 0x9A, 0x4A, 0x26, 0x5A, 0x65, 0xB5, 0xD9, 0x84, 0x86, 0x80, 0xD0, 0x7B, 0x79, 0x7F, 0x2F |
| 4 | 0x9A, 0x4A, 0x26, 0xE1, 0x65, 0xB5, 0xD9, 0x19, 0x2A, 0x51, 0xF2, 0xE6, 0xD5, 0xAE, 0x0D |
| 5 | 0x9A, 0x4A, 0x26, 0xF2, 0x65, 0xB5, 0xD9, 0x4E, 0x12, 0x4F, 0xD1, 0xB1, 0xED, 0xB0, 0x2E |
| 6 | 0x9A, 0x4A, 0x26, 0x3D, 0x65, 0xB5, 0xD9, 0xEE, 0x42, 0x9C, 0xA1, 0x11, 0xBD, 0x63, 0x5E |
| 7 | 0x9A, 0x4A, 0x26, 0x22, 0x65, 0xB5, 0xD9, 0x32, 0xD6, 0x76, 0x5B, 0xCD, 0x29, 0x89, 0xA4 |
| 8 | 0x9A, 0x4A, 0x26, 0x60, 0x65, 0xB5, 0xD9, 0x9F, 0xE1, 0x73, 0x75, 0x60, 0x1E, 0x8C, 0x8A |
| 9 | 0x9A, 0x4A, 0x26, 0x6B, 0x65, 0xB5, 0xD9, 0xA2, 0x71, 0xC4, 0x3C, 0x5D, 0x8E, 0x3B, 0xC3 |
| 10 | 0x9A, 0x4A, 0x26, 0xFA, 0x65, 0xB5, 0xD9, 0x04, 0x95, 0xEB, 0xD8, 0xFB, 0x6A, 0x14, 0x27 |
| 11 | 0x9A, 0x4A, 0x26, 0x6C, 0x65, 0xB5, 0xD9, 0x71, 0x22, 0x66, 0x38, 0x8E, 0xDD, 0x99, 0xC7 |
| 12 | 0x9A, 0x4A, 0x26, 0x18, 0x65, 0xB5, 0xD9, 0x5B, 0xA2, 0xF6, 0x95, 0xA4, 0x5D, 0x09, 0x6A |
| 13 | 0x9A, 0x4A, 0x26, 0x14, 0x65, 0xB5, 0xD9, 0xCC, 0x31, 0x97, 0xC3, 0x33, 0xCE, 0x68, 0x3C |
| 14 | 0x9A, 0x4A, 0x26, 0xD0, 0x65, 0xB5, 0xD9, 0xB1, 0xCA, 0xFB, 0xA6, 0x4E, 0x35, 0x04, 0x59 |
| 15 | 0x9A, 0x4A, 0x26, 0xB4, 0x65, 0xB5, 0xD9, 0x56, 0xA6, 0xBA, 0x79, 0xA9, 0x59, 0x45, 0x86 |

*EACH OCTET IS TRANSMITTED LSB TO MSB

SECURITY PROTECTION OF TERABIT ETHERNET PCS LAYER USING ALIGNMENT MARKERS

TECHNICAL FIELD

The present disclosure relates to terabit Ethernet security protection.

BACKGROUND

The Institute of Electrical and Electronics Engineers (IEEE) 802.3bs standard proposes a physical coding (PCS) sublayer definition for Terabit Ethernet (TbE). Specifically, the standard defines 200 Gigabit Ethernet (200 G or 200 GbE) PCS and 400 Gigabit Ethernet (400 G or 400 GbE) PCS implementations referred to as 200GBASE-R PCS and 400GBASE-R PCS, respectively. The implementations result in multiple PCS lanes (or encoded bit streams); however, the implementations do not define or provide for security protection of the PCS lanes, such as encryption and authentication.

DESCRIPTION OF EXAMPLE EMBODIMENTS

Overview

A method generates, from an input data stream, multiple lanes of a physical coding sublayer (PCS) signal. To generate the PCS signal, the method converts the data stream to a sequence of bit blocks, and periodically inserts into the sequence of bit blocks an alignment marker (AM) group including multiple individual alignment markers for respective ones of the multiple lanes. The method adds security protection to each bit block according to a security protocol to produce a sequence of protected bit blocks, and modifies each AM group with security information to be used by the security protocol to remove the security protection added to the sequence of protected bit blocks. The method applies forward error correction to the sequence of protected bit blocks and the modified AM groups to produce forward error correction codewords, and produces the multiple lanes from the codewords. The method transmits optical signals representing the multiple lanes over an optical link. In an embodiment, the PCS signal includes a Terabit Ethernet PCS signal, such as a 200 or 400 Gigabit Ethernet PCS signal.

Example Embodiments

Figure 1:
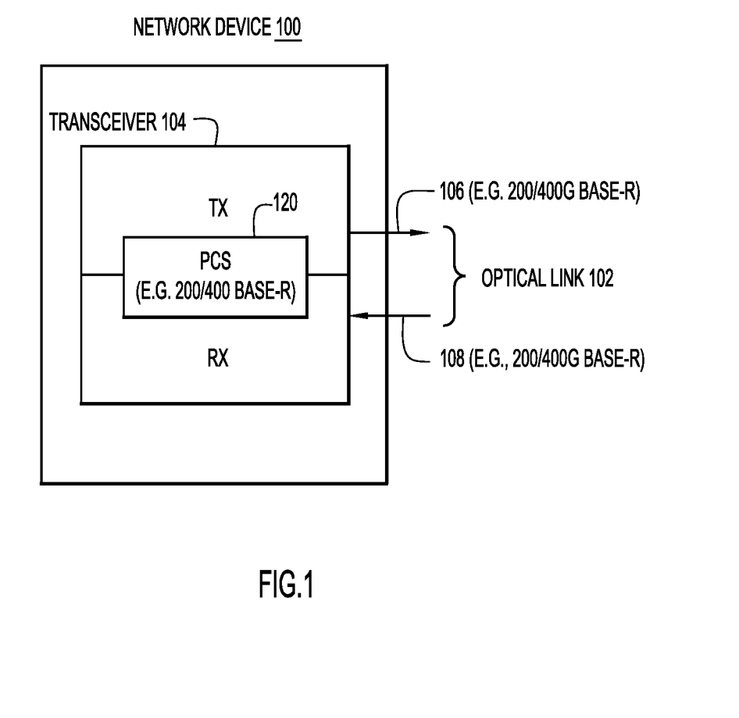
FIG. 1 a high-level block diagram of a Terabit Ethernet (TbE) network device configured to communicate over an optical link, according to example embodiment.

With reference to FIG. 1, there is a high-level block diagram of an example network device 100 configured to communicate with other similarly configured network devices over an optical link 102. Network device 100 includes a Terabit Ethernet (TbE) transmitter (TX)/receiver (RX) (transceiver) 104 to generate and transmit a TbE transmit signal 106 over optical link 102, and receive a TbE receive signal 108 from the optical link and process the receive signal. The term "TbE" is used to describe speeds of Ethernet of 100 Gigabits/s and above, e.g., 200 Gigabit Ethernet (200 G or 200 GbE) and 400 Gigabit Ethernet (400 G or 400 GbE). Transceiver 104 includes a physical coding sublayer (PCS) 120 to generate TbE transmit signal 106 and process TbE receive signal 108 according to a TbE PCS standard/protocol, modified according to embodiments presented herein to include security protection. For example, PCS 120 may operate in accordance with a 200GBASE-R implementation (i.e., a 200GBASE-R PCS) or a 400GBASE-R implementation (i.e., a 400GBASE-R PCS) defined under IEEE P802.3bs, modified to include the security protection. In these examples, PCS 120 generates TbE transmit signal 106 as a modified 200/400GBASE-R signal 106 with security protection, and processes a modified 200/400GBASE-R signal on receive to remove the security protection, according to embodiments described below.

Figure 2:
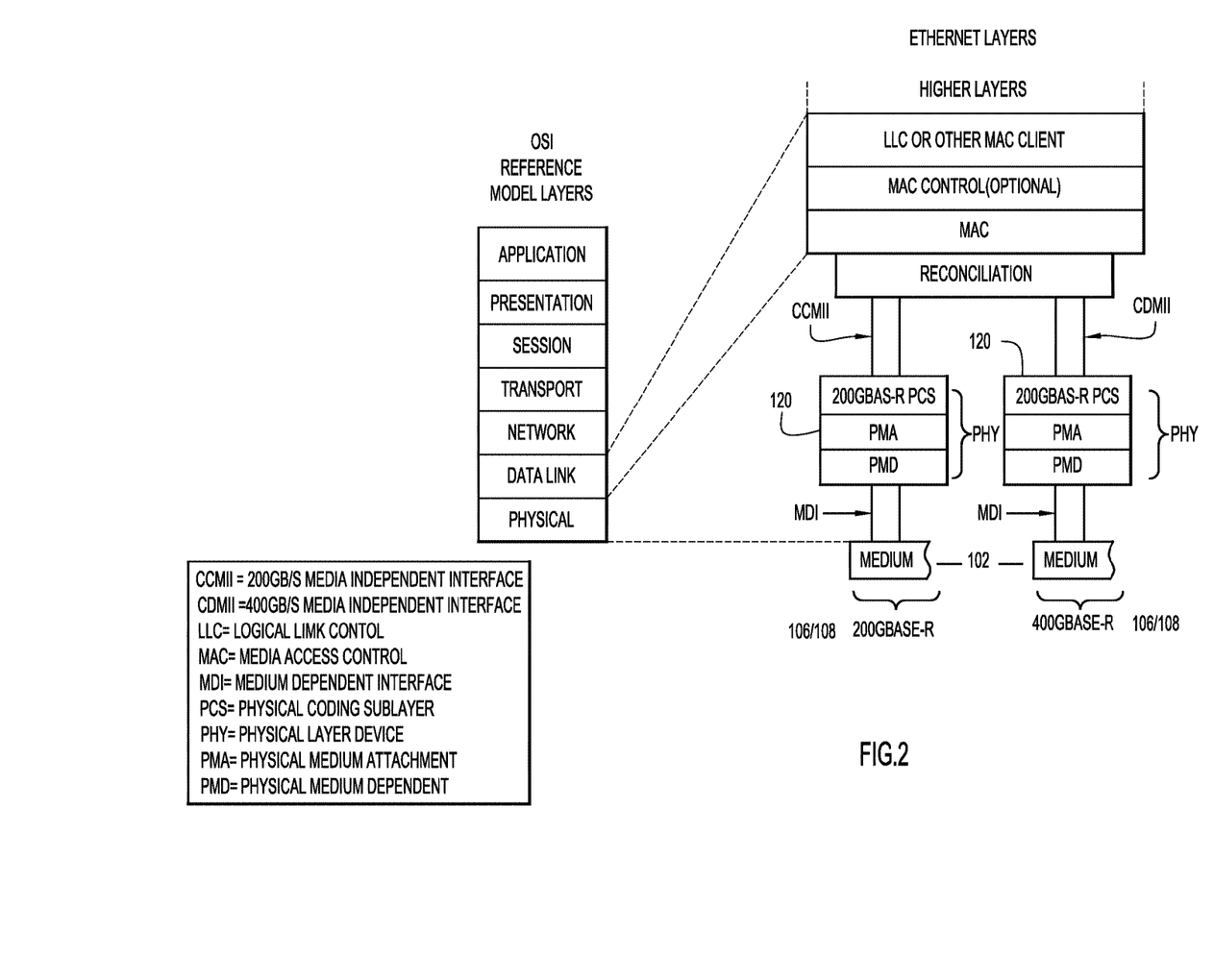
FIG. 2 is an illustration of a relationship of 200/400GBASE-R Physical Coding Sublayer (PCS) to the ISO/IEC Open Systems Interconnection (OSI) reference model and IEEE 802.3 Ethernet model.

With reference to FIG. 2, there is an illustration of a relationship of the 200GBASE-R PCS and the 400GBASE-R PCS (depicted at PCS 120 in FIG. 2) to the ISO/IEC Open Systems Interconnection (OSI) reference model and IEEE 802.3 Ethernet model. Embodiments presented herein add security protection/functionality absent under IEEE P802.3bs to PCS 120.

Figure 3:
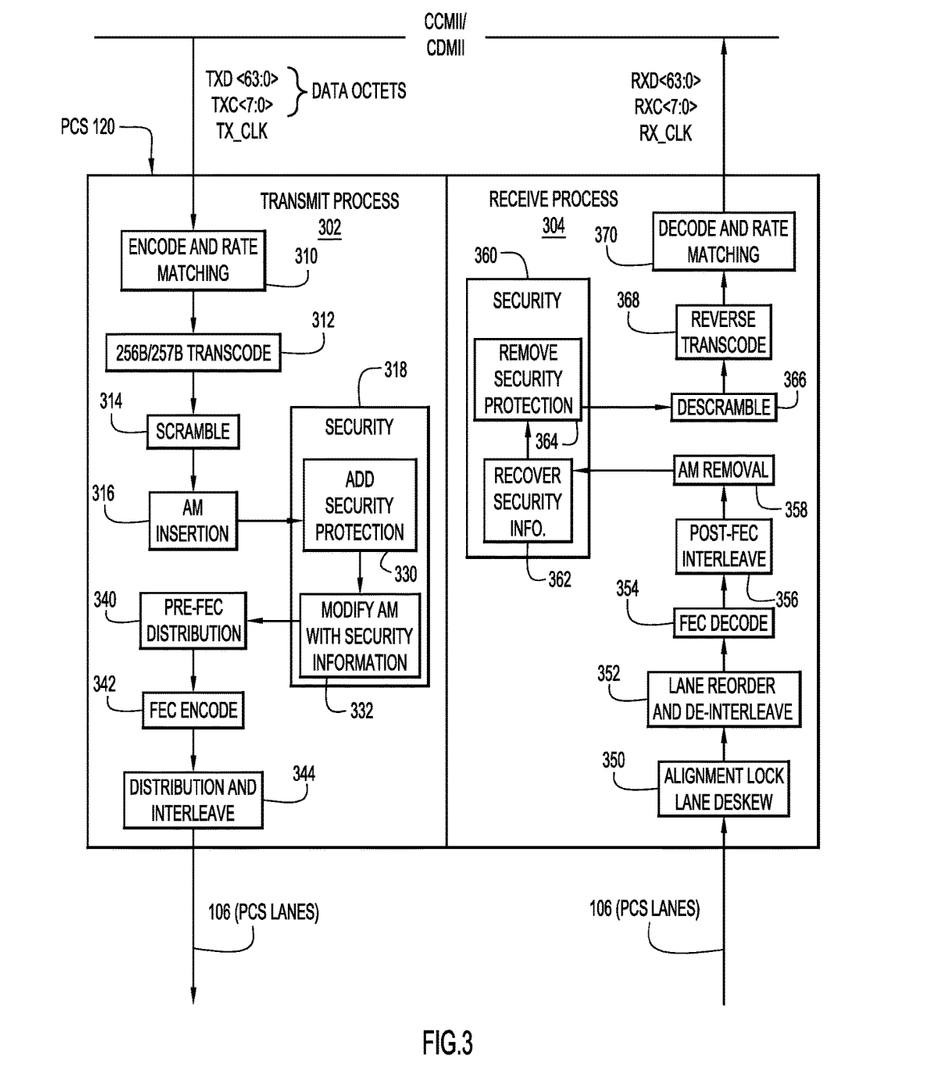
FIG. 3 is a block/functional diagram for a PCS, according to an example embodiment.

With reference to FIG. 3, there is a block/functional diagram for PCS 120, according to an embodiment. PCS 120 includes signal processors including a PCS transmit process 302 (also referred to as a transmit signal processor 302) and a PCS receive process 304 (also referred to as a receive signal processor 304). Transmit process 302 receives an input data stream, e.g., data octets of a CC Media Independent Interface (MII) (CCMII)/CDMII (where CC and CD represent Roman numerals for 200 and 400). From the input data stream, transmit process 302 generates multiple PCS "lanes" conveyed in transmit signal 106. Transmit process 302 adds security protection to the multiple PCS lanes as described below. The 200/400GBASE-R implementations (i.e., PCSs) use 8 and 16 PCS lanes, respectively. A "lane" is an encoded bit stream. PCS transmit process 302 and PCS receive process 304, and their related PCS frame formats, are described below in connection with modified 200/400GBASE-R PCS by way of example, only. It is understood that the techniques described apply equally to any TbE PCS implementation, as would be appreciated by one of ordinary skill in the relevant arts having read the present application.

Transmit process 302 is now described. At 310, process 302 encodes the CCMII/CDMI data octets into a sequence of bit blocks (e.g., 66-bit blocks) using a coding scheme (e.g., a 64/66 coding scheme), and rate matches the bit blocks. At 312, process 302 transcodes the sequence of bit blocks into a sequence of transcoded bit blocks (e.g., 257-bit blocks). At 314, process 302 scrambles the sequence of transcoded bit blocks to produce a sequence of scrambled bit blocks (e.g., 257-bit blocks). At 316, process 302 periodically inserts AM groups into the sequence of scrambled bit blocks, to produce a sequence of scrambled bit-blocks punctuated periodically with the AM groups. Each AM group includes individual AMs for respective ones of the multiple lanes, i.e., the AM group includes an individual AM for each lane. The individual AMs support deskew and reordering of the individual PCS lanes in receive process 304. Operation 316 produces a sequence of scrambled bit-blocks punctuated with periodically inserted AM groups. An example AM groups is described in detail below in connection with FIGS. 7-9.

At 318, process 302 implements security functions according to the embodiments presented herein. Operation 318 includes sub-operations 330 and 332. At 330, process 302 adds security protection to the sequence of scrambled bit blocks (but not the AM groups) in accordance with a security protocol, to produce a sequence of security protected bit blocks. Operation 330 may encrypt each of the scrambled bit blocks using one or more encryption keys, authenticate (e.g., integrity check) the scrambled bit blocks to produce an integrity check value (ICV) over the scrambled bit blocks, or both encrypt and authenticate the scrambled bit blocks according to the security protocol. At 332, process 302 modifies each periodically inserted AM group with security information/parameters related to the security protocol used to protect the scrambled bit blocks at 330, to produce the sequence of protected bit blocks punctuated with the modified AM groups. An example modified AM group is described below in connection with FIGS. 10A and 10B. As will be described below, receive process 304 uses the security information/parameters in the modified AM groups to remove the security protection added at operation 330 and perform replay protection.

Operation 332 may modify only a part/portion of each AM group with the security information/parameters, leaving the remainder of each AM group unmodified. This way, the respective bit-sizes of the AM group and the modified AM group are the same. Operation 332 may modify each AM group with security information to include a security tag having parameters that (i) identify, or enable recovery of, the one or more encryption keys and/or encryption techniques used in operation 330 to encrypt the scrambled bit blocks, and (ii) provide replay protection via packet sequence numbers, for example. The security information may also include the ICV used by operation 330 to authenticate previous scrambled bit blocks. In an embodiment in which operation 330 acquires the one or more encryption keys via a key agreement protocol, operation 332 may also modify a part of each of at least some of the AM groups to transport a communication channel for the key agreement protocol (i.e., to implement an in-band key agreement communication channel (KA-CC)). In other words, operation 332 modifies the AM groups to implement the KA-CC over which key agreement protocol messages may be exchanged with another PCS. As will be described more fully below, operation 332 may simply replace a part, but not all, of each AM group with the security information so as to maintain the size of the AM group as output by preceding operation 316.

Operation 330 may add security protection based on, or in accordance with, any currently known or hereafter developed security protocol. In one non-limiting example, operation 330 adds security protection based on, or in accordance with, the Media Access Control Security (MACsec) standard defined in IEEE 802.1AE. For MACsec, operation 330 encrypts and authenticates the scrambled bit blocks based on, or in accordance with, the MACsec standard, and operation 332 modifies (i) a part of each AM group to include a security tag (SECTAG) related to the encryption, (ii) a part of each AM group to include an ICV related to the authentication, and (iii) a part of each of at least some of the AM groups to transport a MACSEC-related key exchange protocol, such as the MACsec Key Agreement (MKA) protocol. The MACsec protocol is briefly described below in connection with FIGS. 11 and 12.

At 340, process 302 pre-distributes the sequence of security protected bit blocks punctuated with the modified AM groups across multiple (e.g., two) parallel forward error correction (FEC) encode processes, to produce pre-distributed bit blocks. At 342, process 302 FEC encodes the pre-distributed bit blocks (e.g., using a Reed Solomon (RS) (514,544) encode process) into multiple (e.g., two) FEC codewords. At 344, process 302 distributes and interleaves the multiple FEC codewords across the multiple PCS lanes to be conveyed via transmit signal 106. Process 302 transmits the multiple PCS lanes of transmit signal 106 over optical link 102.

Receive process 304 is now described. Process 304 is, for the most part, the reverse of transmit process 302. Process 304 receives multiple PCS lanes transmitted by a corresponding PCS transmit process 302 via receive signal 108. At 350, process 304 forms individual PCS lanes from the multiple (receive) PCS lanes, and obtains lock on the individual AMs in each PCS lane. Once lock is achieved, process 302 removes inter-lane skew, i.e., deskews the PCS lanes. At 352, the PCS lanes, including the FEC codewords, are reordered and deinterleaved. At 354, process 304 FEC decodes the FEC codewords, to produce decoded data. At 356, process 304 interleaves the decoded data to produce a sequence of decoded bit blocks punctuated by the modified AMs as created by transmit process 302, i.e., to recreate the corresponding sequence generated by the transmit process. At 358, process 304 removes the modified AM groups (as represented by the modified individual AMs) from the sequence of decoded bit blocks, and stores in memory the security information/parameters from the modified AM groups for access in next operation 360.

At 360, process 304 removes the security protection added to the PCS lanes by transmit process 302, according to the embodiments presented herein. Operation 360 includes sub-operations 362 and 364. At 362, process 304 retrieves/accesses the security information/parameters made available by operation 358. At 364, process 302 removes the security protection (e.g., encryption and/or authentication) from the sequence of decoded bit blocks using the retrieved security information/parameters in accordance with the security protocol, to produce a sequence of bit blocks from which the protection is removed. Operation 364 may decrypt and/or authenticate the decoded bit blocks using the retrieved security information/parameters. More specifically, operation 364 may: (i) use the retrieved security information/parameters to retrieve the one or more encryption keys used for encryption in operation 318 of transmit process 302, and decrypt the decoded bit blocks with the one or more encryption keys; and/or (ii) use the ICV in the retrieved security information/parameters to authenticate the decoded bit blocks, either in their encrypted or decrypted state.

At 366, process 304 descrambles the sequence of bit blocks from which the protection is removed, to produce a sequence of unscrambled bit blocks. At 368, process 304 reverse transcodes the sequence of unscrambled bit blocks, to produce a sequence of reverse transcoded bit blocks. At 370, process 304 decodes and rate matches the reverse transcoded bit blocks to produce a sequence of CCMII/CDMII data octets representative of the data octets initially provided to transmit process 302.

Blocks 302-370 are described above as logic operations. It is understood that the blocks may also represent logic modules 302-370, implemented in hardware, software, and/or firmware modules (including, but not limited to application specific integrated circuits (ASICs) and the like) that perform the corresponding logic operations described above, such as: a PCS transmitter 302 including an encoder and rate matcher 310, a transcoder 312, a scrambler 314, an AM inserter 316, a security module 318 (including a security protector 330 and an AM modifier 332), a pre-FEC distributer 340, an FEC encoder 342, and a distributer and interleaver 344; and a PCS receiver 304 including an alignment lock lane deskewer 350, a lane reorder and de-interleaver 352, an FEC decoder 354, a post FEC interleaver 356, an AM remover 358, a security block 360 (including a security information recoverer 363 and a security protection remover 364), a descrambler 366, a reverse transcoder 368, and a decoder and rate matcher 370.

Figure 4:
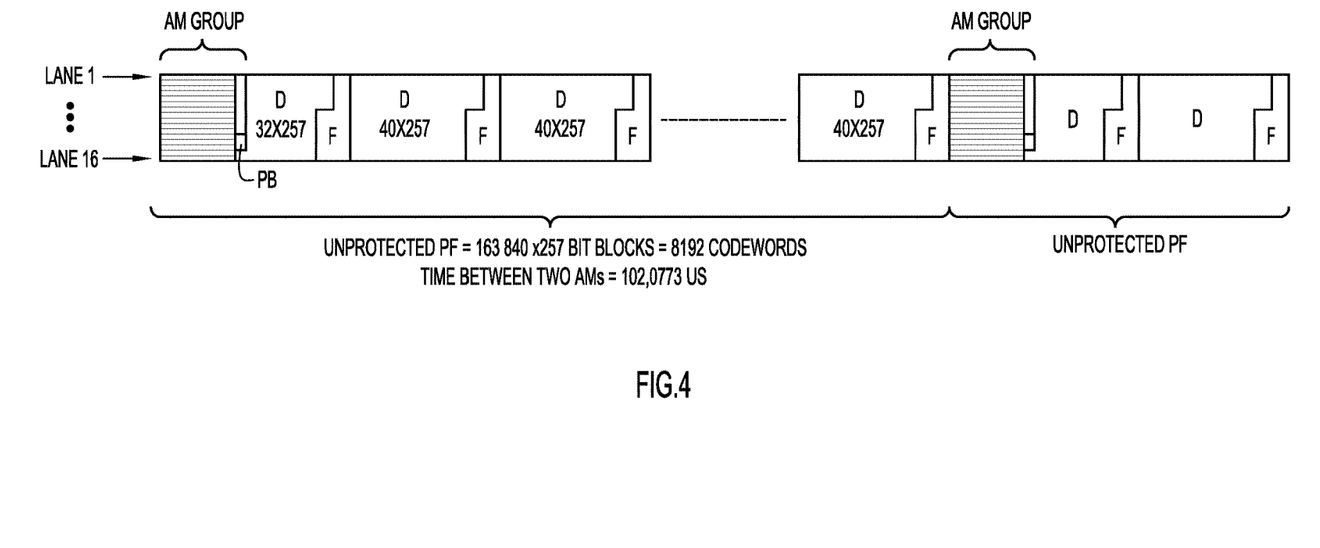
FIG. 4 is an illustration of unprotected PCS frames generated by a PCS transmit process for 400GBASE-R.

With reference to FIG. 4, there is an illustration of example unprotected PCS frames PF for 400GBASE-R generated by a PCS transmit process in accordance with IEEE P802.3bs, without added security protection as described above. Each frame PF conveys 16 PCS lanes. Each PCS frame includes an AM group followed by a sequence of 163,840 257 bit blocks corresponding to 8192 FEC codewords. The AM group includes 16 individual AMs, one for each PCS lane, and terminates with pad bits PB. The sequence of 163,840 257 bit blocks includes a first set of 32 257 bit blocks, a second set of 40 257 bit blocks, a third set of 40 257 bit blocks, and so on, leading to the 163,840 257 bit blocks. Each set "D" of bit blocks carries/conveys payload data (i.e., the encoded, transcoded, scrambled, and FEC encoded CCMII/CDMII data octets and FEC encoded AM groups) and terminates with a respective block F of FEC parity bits. Successive AM groups for successive PCS frames PF are separated in time by 102,773 microseconds (us).

Figure 5:
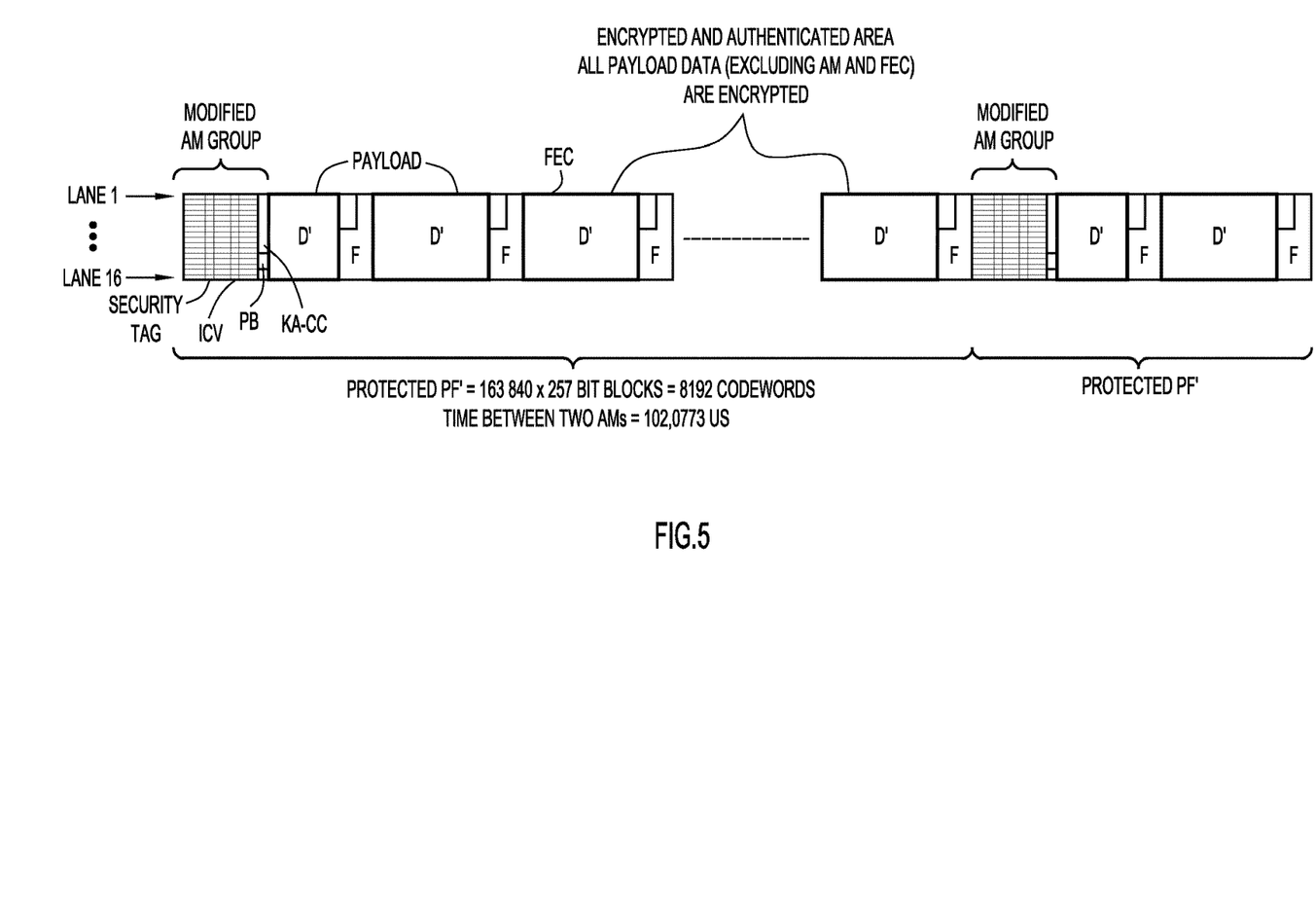
FIG. 5 is an illustration of security protected PCS frames generated by a PCS transmit process for 400GBASE-R PCS, according to an example embodiment.

With reference to FIG. 5, there is an illustration of example security protected PCS frames PF' for 400GBASE-R PCS generated by transmit process 302, with the added security protection described above. Specifically, each protected PCS frame PF' includes a sequence of security protected bit blocks D' that are encrypted and authenticated in accordance with a security protocol. Each modified AM group includes security information in the form of a security tag associated with the encryption of the bit blocks and an ICV associated with authentication of the bit blocks. Some of the pad bits of each AM group convey a KA-CC. In the embodiment shown in FIG. 5, the modified AM groups and FEC blocks F are not security protected and thus are passed transparently from transmit process 302 to receive process 304.

Figure 6:
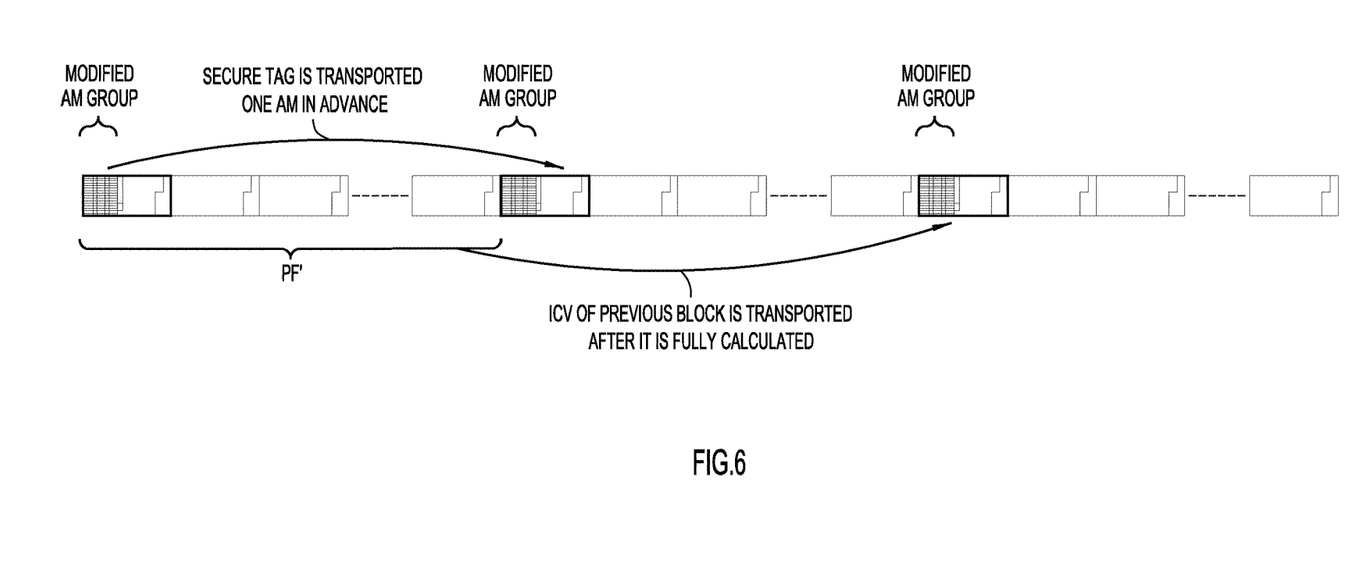
FIG. 6 is an illustration of security protected PCS frames showing a timing relationship between security information in modified alignment marker (AM) groups and the PCS frames to which the security information applies, according to an example embodiment.

With reference to FIG. 6, there is an illustration of example security protected PCS frames PF' showing a timing relationship between the security information (i.e., the security tag and the ICV) in each modified AM group and the PCS frames PF' to which the security information applies. As shown in FIG. 6, the security tag is transported in the modified AM group that is in advance of the sequence of transmitted, protected PCS frames to which the security tag applies. Also, the ICV is transported in the modified AM group following the time when the ICV for the bit blocks previous to that modified AM group is fully calculated.

The AM groups described above for PCS frames without security protection are now described in detail with reference to FIGS. 7-9.

Figure 7:
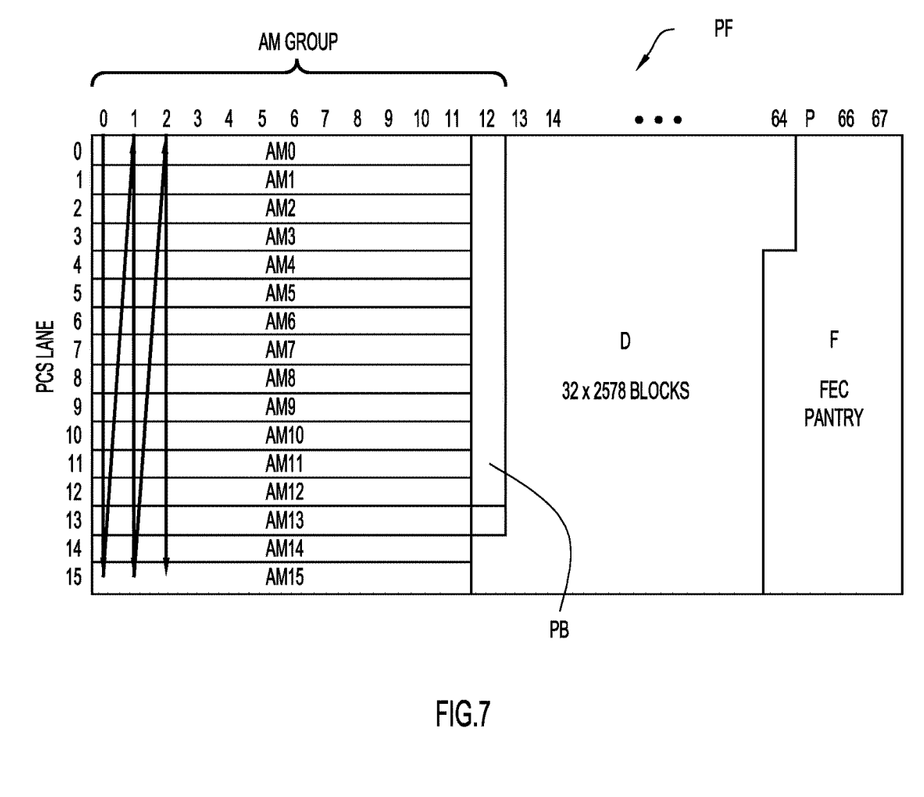
FIG. 7 is an illustration of a beginning portion of an unprotected PCS frame for 400GBASE-R showing an AM group that is not modified to include security information, followed by an encoded bit block.
Figure 8:
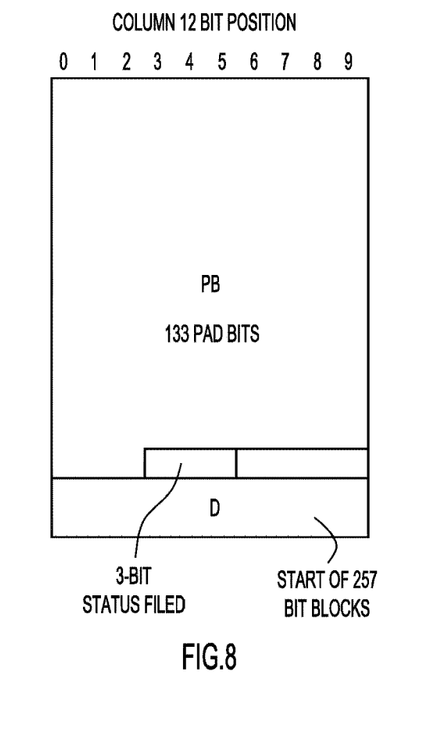
FIG. 8 shows an expanded view of pad bits and a start of the encoded bit block from FIG. 7.

FIG. 7 is an illustration of a beginning portion of an unprotected PCS frame PF for 400GBASE-R showing (i) an AM group that is not modified to include security information, followed by (ii) an encoded bit block D+F. The AM group includes 16 individual AMs 0-15, one for each of the 16 PCS lanes, and also includes pad bits PB. FIG. 8 shows an expanded view of pad bits PB and a start of the encoded bit block D+F from FIG. 7. For the 400GBASE-R PCS, the AM group is composed of a 120-bit AM for each of the 16 PCS lanes plus an additional 133-bit pad and a 3-bit status field to yield the equivalent of 8 257-bit blocks, or 2056 bits. For the 200GBASE-R PCS, an AM group is composed of the AMs for all 8 PCS lanes plus an additional 65-bit pad (i.e., 65 pad bits) and a 3-bit status field to yield the equivalent of four 257-bit blocks.

Figure 9:
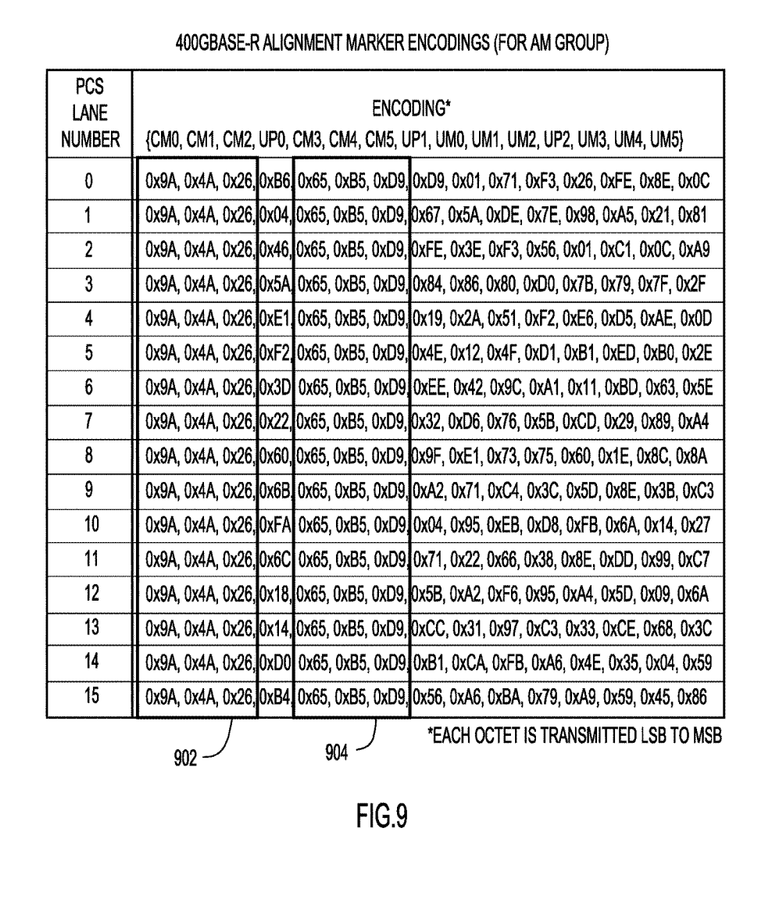
FIG. 9 is an illustration of individual AM encodings for the AM group from FIG. 7.

With reference to FIG. 9, there is an illustration of individual AM encodings, i.e., contents of the individual AMs in the AM group from FIG. 7, for 400GBASE-R PCS. The individual AMs are each formed from a known pattern or sequence of data octets {CM0, CM1, CM2, UP0, CM3, CM4, CM5, UP1, UM0, UM1, UM2, UP2, UM3, UM4, UM5}. Each (individual) AM includes a portion that is common across all alignment markers (the common portion is designated as CM0-CM5, indicated at column blocks 902 and 904 in FIG. 9), a unique portion per PCS lane (the unique portion is designated as UM0-UM5), and finally a unique pad per PCS lane (the pad portion is designated as UP0-UP2). The same information transported in common fields CM0-CM5 across all 16 individual AMs introduces a redundancy exploited by the security protection presented herein. That is, the security protection replaces a part, but not all, of the common fields with the above-described security information, i.e., the security tag and the ICV, as shown by way of example in FIG. 10A.

Figure 10A:
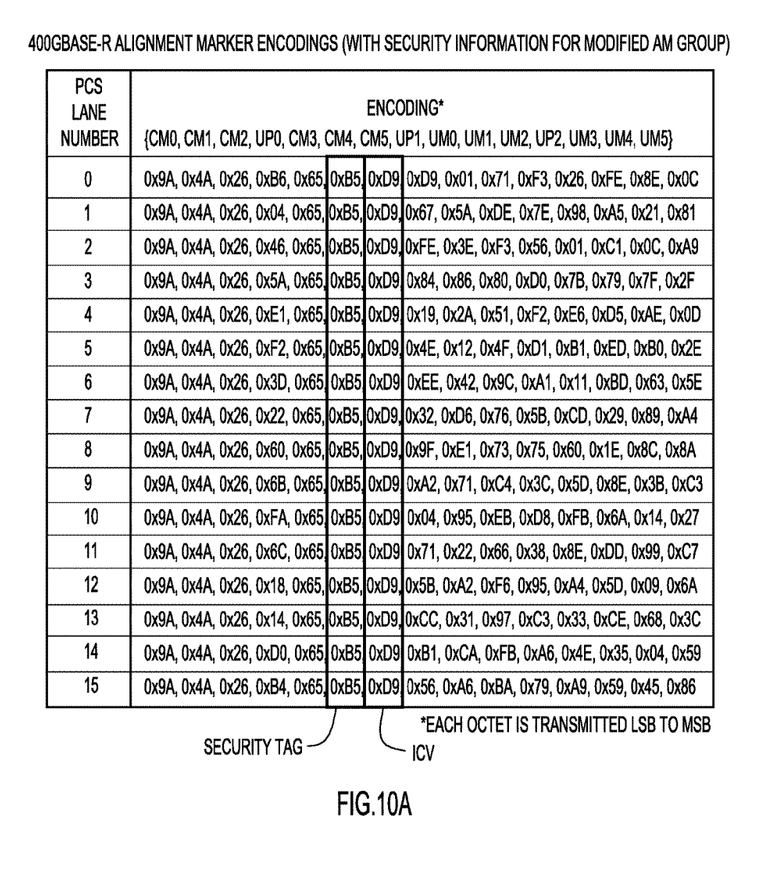
FIG. 10A is an illustration of the AM group from FIG. 9, modified by security operations of a PCS transmit process, to include security information associated with security protection added to an associated PCS frame, according to an example embodiment.

The modified AM groups for protected PCS frames, i.e., PCS frames to which security protection has been added, are now described with reference to FIG. 10A. FIG. 10A is an illustration of the AM group from FIG. 9, modified by security operation 318 of transmit process 302, to include the security information associated with the security protection added to the associated PCS frame. In the example of FIG. 10A, security operation 318 replaces only field CM3 in each PCS lane with contents of a security tag, and replaces only field CM4 in each PCS lane with contents of the ICV. Thus, security operation 318 replaces only a portion of each (individual) AM with the security information and, overall, replaces only a portion of the AM group with the security information. In the non-limiting example of FIG. 10A, the security tag and the ICV replace common fields CM3 and CM4, respectively. In other examples, the security tag and the ICV may replace other ones of the common fields CM0-CM5, and may reverse the order shown in FIG. 10A. Also, the security information may include only the security tag or only the ICV, depending on which one (i.e., if only one) is used in the security protection.

Figure 10B:
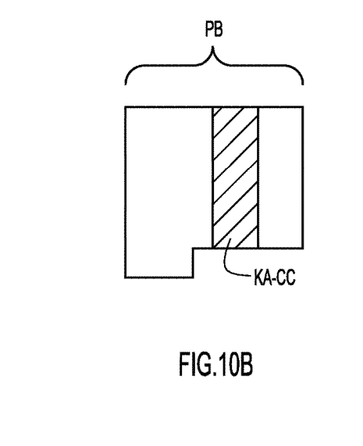
FIG. 10B is an illustration in which pad bits of the modified AM group from FIG. 10A have been replaced with key exchange information of a key agreement communication channel (KA-CC), according to an example embodiment.

Security operation 318 may also modify the AM group to include key exchange information of a KA-CC in the pad bits PB of the AM group. For example, security operation 318 may replace some, but not all, of the pad bits in the AM group with the key exchange information. With reference to FIG. 10B, there is an illustration in which some of the pad bits PB of the modified AM group have been replaced with the key exchange information of the KA-CC. An advantage of the above-described embodiments is the use of the modified AM groups to add security protection to PCS lanes, and remove the security from the PCS lanes, without having to increase a size of the PCS frame relative to when the security protection is not added, i.e., while maintaining the overall PCS frame format and frame aligning based on the AM groups prior to any addition of security protection. Thus, the embodiments do not require an increase in transmission bandwidth relative to implementations that do not add security protection. The embodiments replace redundant information in the AM groups with information that aids in the security protection. The embodiments advantageously do not require flow control support. The embodiments offer low and stable latency, small packet delay variation, and do not require large memory increases.

Figure 11:
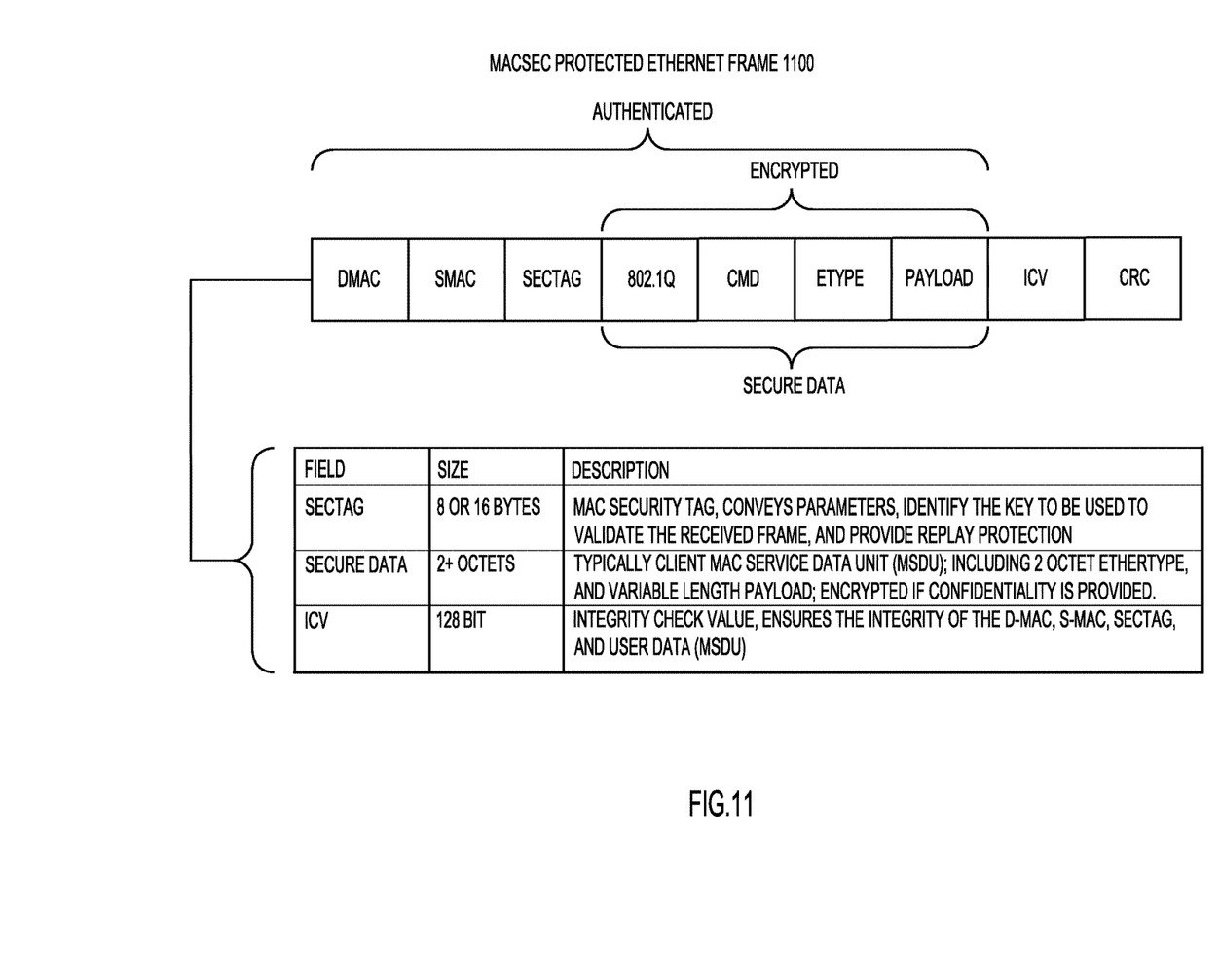
FIG. 11 is an illustration of an Ethernet frame protected using Media Access Control Security (MACsec) in accordance with IEEE 802.1AE.
Figure 12:
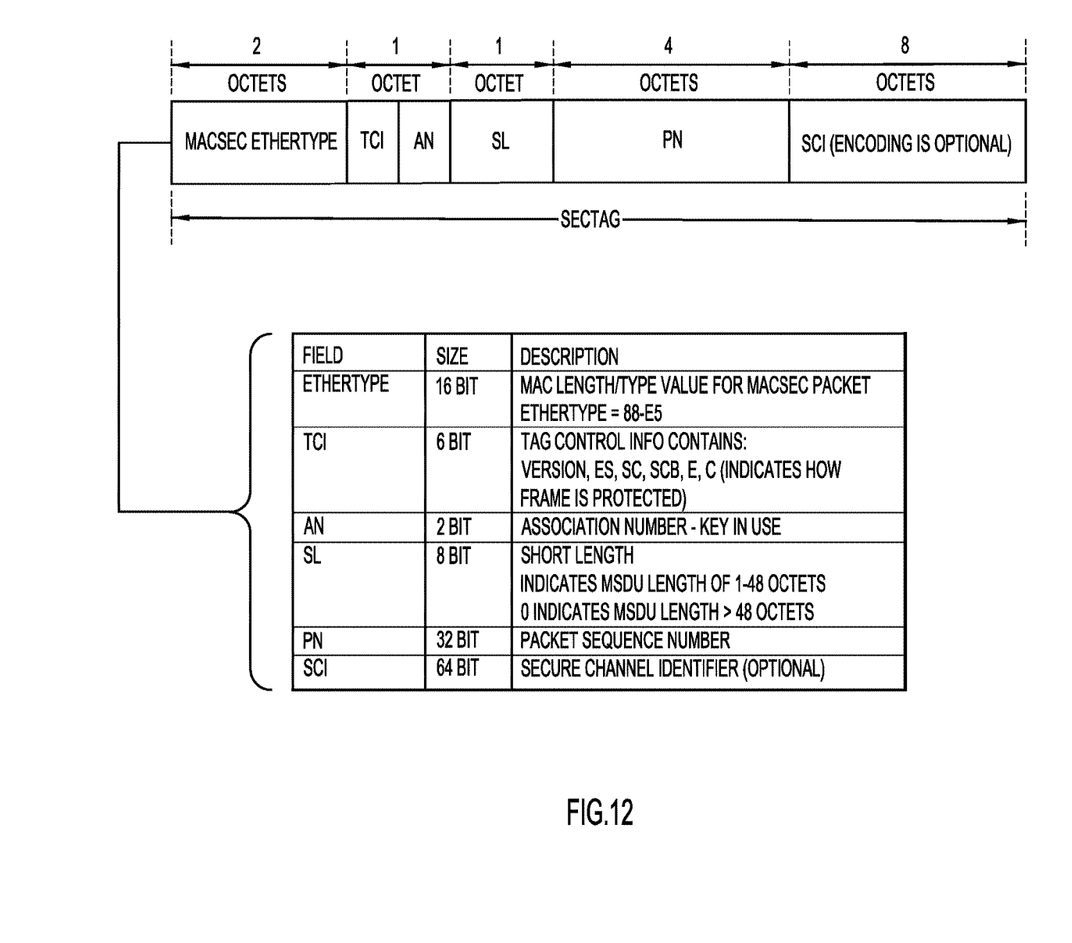
FIG. 12 is an illustration of fields of a MACsec security tag (SECTAG) and definitions for fields of the SECTAG that may be incorporated in the modified AM group of FIG. 10A, according to an example embodiment.

With reference to FIG. 11, there is an illustration of an Ethernet frame 1100 protected using MACsec in accordance with IEEE 802.1AE. MACsec protected Ethernet frame 1100 includes a security tag SECTAG associated with the encrypted data, and an ICV associated with authentication/integrity checking of the Ethernet frame. As described above, transmit process 302 may security protects PCS lanes using MACsec, in which case the modified AM groups include a SECTAG and an ICV similar to those shown in FIG. 11, and expanded on in FIG. 12. With reference to FIG. 12, there is an illustration of fields of the SECTAG and definitions for fields of the SECTAG that may be incorporated in the modified AM group. In conventional MACsec, the SECTAG and ICV are added fields that increase the size of the overall Ethernet frame relative to when MACsec is not used. Thus, the added overhead requires that the transmission bandwidth be increased to maintain the same throughput of payload data relative to when the MACsec protection is not used. In contrast, the embodiments used herein advantageously do not require such an increase in transmission bandwidth to maintain the same throughput because the security tag and ICV replace common existing AM fields of the AM group, and thus do not increase the overall (original) size of the PCS frame prior to adding the security protection.

Figure 13:
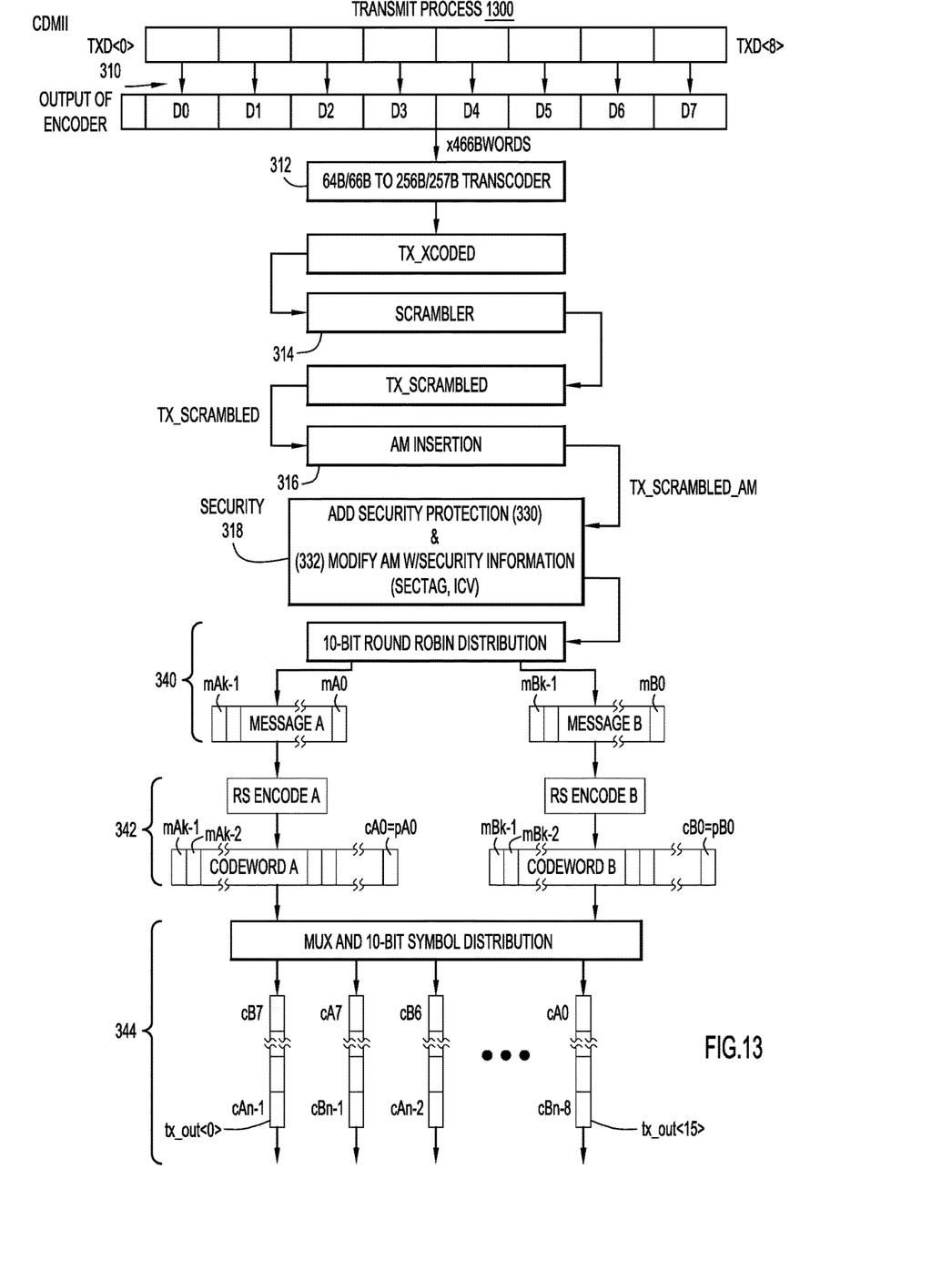
FIG. 13 is a detailed function/block diagram for a transmit process for 400GBASE-R PCS based on IEEE P802.3bs, modified/extended to support security protection, according to an example embodiment.

With reference to FIG. 13, there is a detailed function/block diagram for a transmit process 1300 for 400GBASE-R PCS based on IEEE P802.3bs, but modified/extended to support security protection as described herein. FIG. 13 shows mappings between operations of transmit process 302 and corresponding blocks of transmit process 1300.

Figure 14:
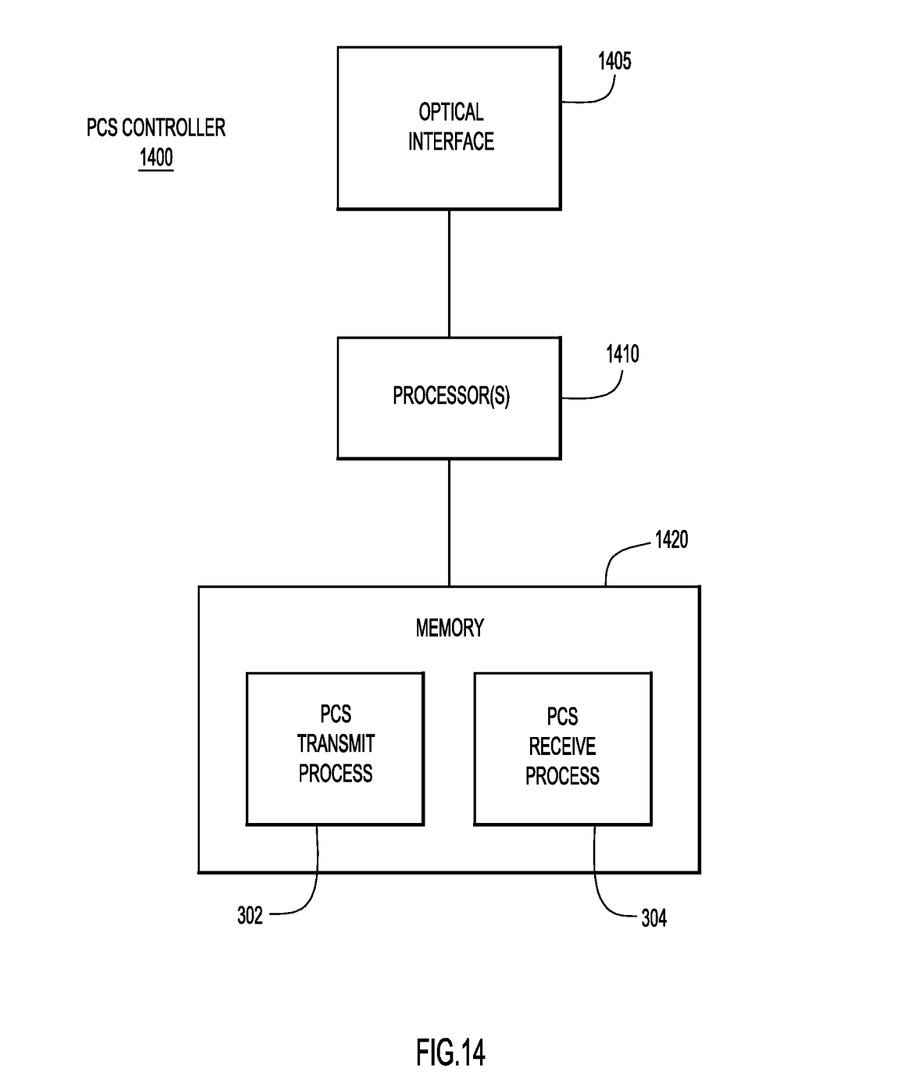
FIG. 14 is a block diagram of a PCS controller for the network device of FIG. 1, according to an example embodiment.

With reference to FIG. 14, there is depicted a block diagram of an example controller 1400 for PCS 120, that may be implemented in transceiver 104 of network device 100. Controller 1400 includes an optical interface unit 1405, such as a low-level optical transceiver, configured to enable controller 1400 to transmit/receive optical signals to/from an optical medium. That is, the low-level optical transceiver includes an optical transmitter to convert electrical signals (e.g., in digital form) from one or more processor(s) 1410 to optical signals and transmit the optical signals over an optical medium, and an optical receiver to convert optical signals received over the optical medium to electrical signals (e.g., in digital form) and deliver the electrical signals to the one or more processor(s). One or more processors 1410 are provided that execute software stored in memory 1420. Processor(s) 1410 include, for example, one or more microprocessors and/or microcontrollers. To this end, the memory 1420 stores instructions for software stored in the memory that are executed by processor(s) 1410 to perform the methods described herein.

Memory 1420 may comprise read/write memory, read only memory (ROM), random access memory (RAM), magnetic disk storage media devices, optical storage media devices, flash memory devices, electrical, optical, or other physical/tangible memory storage devices. Thus, in general, the memory 1420 may comprise one or more tangible (non-transitory) computer readable storage media (e.g., a memory device) encoded with software comprising computer executable instructions and when the software is executed (by the processor(s) 1410) it is operable to perform the operations described herein. Memory 1420 may store logic for PCS transmit process 302 and PCS receive process 304 to implement PCS 120 described above.

In addition, memory 1420 stores data used and generated by the processor 1410 when executing the logic described above.

In summary, embodiments presented herein add security protection to a TbE PCS layer, such as the 200GBASE-R and the 400GBASE-R extender sublayers and first generation PCS. For example, the 400GBASE-R extender sublayer and first generation PCS comprises sixteen PCS lanes, built from two interleaved Reed-Solomon (RS) (544,514) codewords. An AM group is sent once per 4096 frames. Since the frames are based on 257-bits blocks and the FEC is RS(514, 544), the space available for the AM group is 8*257 bits blocks, which is larger than the size needed to align the 16 lanes. For example, the AM group includes 133 pad bits simply to maintain 257 bits multiplicity. The AM group is based on 15 bytes for each of the 16 lanes for a total of 1920 bits. In contrast, the 100 GbE AM group is based on 8 bytes for each PCS lane, for a total of 1280 bits over 20 lanes (which is 640 bits less than for the 400 GbE). Six bytes of each AM for each lane (so in total 6×16 bytes) are common markers across all of the AMs, while the other 6 bytes are unique markers. The embodiments exploit the common marker. For example, the embodiments replace 32 bytes (two bytes for each lane), with 16 bytes used for a security tag and 16 bytes dedicated to an ICV. In one example, the embodiments replace CM3 with the security tag and CM4 with the ICV, similar to the way MACsec tags an Ethernet frame, which dedicates 16 bytes for the SECTAG and 16 bytes for the ICV. In this way the PCS layer may transport all the needed information to support encryption and authentication, while AM group pad bits may transport an in-band channel for a key agreement protocol.

In summary, in one form, a method is provided comprising: generating, from an input data stream, multiple lanes of a physical coding sublayer (PCS) signal (e.g., multiple lanes of a Terabit Ethernet PCS signal, such as a 200 or 400 Gigabit Ethernet PCS signal), the generating including: converting the data stream to a sequence of bit blocks; periodically inserting into the sequence of bit blocks an alignment marker (AM) group including multiple individual alignment markers for respective ones of the multiple lanes; adding security protection to each bit block according to a security protocol to produce a sequence of protected bit blocks; modifying each AM group with security information to be used by the security protocol to remove the security protection added to the sequence of protected bit blocks; applying forward error correction to the sequence of protected bit blocks and the modified AM groups to produce forward error correction codewords; producing the multiple lanes from the codewords; and transmitting optical signals representing the multiple lanes over an optical link.

In another form, an apparatus is provided comprising: a transmit signal processor including a physical coding sublayer (PCS) configured to generate, from an input data stream, multiple lanes of a PCS signal, wherein the PCS is configured to: convert the data stream to a sequence of bit blocks; periodically insert into the sequence of bit blocks an alignment marker (AM) group including multiple individual alignment markers for respective ones of the multiple lanes; add security protection to each bit block according to a security protocol to produce a sequence of protected bit blocks; modify each AM group with security information to be used by the security protocol to remove the security protection added to the sequence of protected bit blocks; apply forward error correction to the sequence of protected bit blocks and the modified AM groups to produce forward error correction codewords; produce the multiple lanes from the codewords; and an optical transmitter coupled to the transmit signal processor and configured to transmit optical signals representing the multiple lanes over an optical link.

In yet another form, a non-transitory computer readable medium is provided. The computer readable medium is encoded with instruction that, when executed by a processor of a transmitter, cause the processor to perform to perform a method comprising: generating, from an input data stream, multiple lanes of a physical coding sublayer (PCS) signal, the generating including: converting the data stream to a sequence of bit blocks; periodically inserting into the sequence of bit blocks an alignment marker (AM) group including multiple individual alignment markers for respective ones of the multiple lanes; adding security protection to each bit block according to a security protocol to produce a sequence of protected bit blocks; modifying each AM group with security information to be used by the security protocol to remove the security protection added to the sequence of protected bit blocks; applying forward error correction to the sequence of protected bit blocks and the modified AM groups to produce forward error correction codewords; producing the multiple lanes from the codewords; and supplying data representing the multiple lanes to an optical transmitter to cause the optical transmitter to transmit optical signals representing the multiple lanes over an optical link.

The above description is intended by way of example only. Various modifications and structural changes may be made therein without departing from the scope of the concepts described herein and within the scope and range of equivalents of the claims.

What is claimed is:

1. A method comprising:
generating, from an input data stream, multiple lanes of a physical coding sublayer (PCS) signal, the generating including:
converting the data stream to a sequence of bit blocks;
periodically inserting into the sequence of bit blocks an alignment marker (AM) group including multiple individual alignment markers for respective ones of the multiple lanes;
adding security protection to each bit block according to a security protocol to produce a sequence of protected bit blocks;
replacing a part, but not all, of each AM group with security information to be used by the security protocol to remove the security protection added to the sequence of protected bit blocks;
applying forward error correction to the sequence of protected bit blocks and the replaced AM groups to produce forward error correction codewords; and
producing the multiple lanes from the codewords; and
transmitting optical signals representing the multiple lanes over an optical link.

2. The method of claim 1, wherein:
the individual alignment markers each include a unique portion mapped to the respective lane and a common portion that is common across the multiple lanes; and
the replacing includes replacing, with the security information, a part of each common portion across the multiple lanes.

3. The method of claim 2, wherein:
the replacing further includes replacing, with the security information, the part of each common portion across the multiple lanes and not any part of each unique portion.

4. The method of claim 1, wherein:
the adding the security protection includes encrypting the bit blocks with one or more encryption keys to produce the protected bit blocks as encrypted bit blocks; and
the replacing includes replacing the part of each AM group with the security information to include information identifying the one or more encryption keys.

5. The method of claim 4, wherein:
the adding the security protection further includes authenticating the bit blocks to produce the protected bit blocks as authenticated bit blocks; and
the replacing further includes replacing the part of each AM group with the security information to further include an integrity check value (ICV) associated with the authenticating.

6. The method of claim 4, wherein:
at least some of the individual alignment markers further include padding bits for the respective lanes; and
the replacing further includes replacing at least some of the padding bits to transport a key agreement communication channel over which the one or more encryption keys are made available to the encrypting.

7. The method of claim 1, wherein:
the adding the security protection includes media access control (MACSEC) encrypting and authenticating the bit blocks; and the replacing includes replacing a portion of each AM group with a MACSEC security tag (SECTAG) associated with the encrypting and a MACsec integrity check value (ICV) associated with the authenticating.

8. The method of claim 1, wherein:
the converting includes encoding and transcoding the input data stream; and
the producing includes distributing and interleaving the codewords to produce the multiple lanes.

9. The method of claim 1, wherein the PCS signal includes a Terabit Ethernet PCS signal.

10. The method of claim 1, further comprising:
receiving the multiple lanes that are transmitted;
using the individual alignment markers in each AM group, aligning, deskewing, and reordering the multiple lanes;
decoding the forward error correction codewords and each replaced AM group conveyed in the multiple lanes;
retrieving from the replaced AM groups the security information therein; and
removing the security protection from the protected bit blocks according to the security protocol using the security information retrieved from the replaced AM groups.

11. An apparatus comprising:
a transmit signal processor including a physical coding sublayer (PCS) configured to generate, from an input data stream, multiple lanes of a PCS signal, wherein the PCS is configured to:
convert the data stream to a sequence of bit blocks;
periodically insert into the sequence of bit blocks an alignment marker (AM) group including multiple individual alignment markers for respective ones of the multiple lanes;
add security protection to each bit block according to a security protocol to produce a sequence of protected bit blocks;
replace a part, but not all, of each AM group with security information to be used by the security protocol to remove the security protection added to the sequence of protected bit blocks;
apply forward error correction to the sequence of protected bit blocks and the replaced AM groups to produce forward error correction codewords; and
produce the multiple lanes from the codewords; and
an optical transmitter coupled to the transmit signal processor and configured to transmit optical signals representing the multiple lanes over an optical link.

12. The apparatus of claim 11, wherein:
the individual alignment markers each include a unique portion mapped to the respective lane and a common portion that is common across the multiple lanes; and
the PCS is configured to replace by replacing, with the security information, a part of each common portion across the multiple lanes.

13. The apparatus of claim 12, wherein:
the PCS is further configured to replace by replacing, with the security information, the part of each common portion across the multiple lanes and not any part of each unique portion.

14. The apparatus of claim 11, wherein:
the PCS is configured to add the security protection by encrypting the bit blocks with one or more encryption keys to produce the protected bit blocks as encrypted bit blocks; and the PCS is configured to replace by replacing the part of each AM group with the security information to include information identifying the one or more encryption keys.

15. The apparatus of claim 14, wherein:
at least some of the individual alignment markers further include padding bits for the respective lanes; and
the PCS is further configured to replace by replacing at least some of the padding bits to transport a key agreement communication channel over which the one or more encryption keys are made available to the encrypting.

16. A non-transitory computer readable medium encoded with instructions that, when executed by a processor of a transmitter, cause the processor to perform a method comprising:
generating, from an input data stream, multiple lanes of a physical coding sublayer (PCS) signal, the generating including:
converting the data stream to a sequence of bit blocks;
periodically inserting into the sequence of bit blocks an alignment marker (AM) group including multiple individual alignment markers for respective ones of the multiple lanes;
adding security protection to each bit block according to a security protocol to produce a sequence of protected bit blocks;
replacing a part, but not all, of each AM group with security information to be used by the security protocol to remove the security protection added to the sequence of protected bit blocks;
applying forward error correction to the sequence of protected bit blocks and the replaced AM groups to produce forward error correction codewords;
producing the multiple lanes from the codewords; and
supplying data representing the multiple lanes to an optical transmitter to cause the optical transmitter to transmit optical signals representing the multiple lanes over an optical link.

17. The non-transitory computer readable medium of claim 16, wherein:
the individual alignment markers each include a unique portion mapped to the respective lane and a common portion that is common across the multiple lanes; and
the instructions to cause the processor to perform the replacing include instructions to cause the processor to perform replacing, with the security information, a part of each common portion across the multiple lanes.

18. The apparatus of claim 11, wherein the PCS signal includes a Terabit Ethernet PCS signal.

19. The non-transitory computer readable medium of claim 16, wherein the PCS signal includes a Terabit Ethernet PCS signal.

20. The non-transitory computer readable medium of claim 16, wherein:
the instructions to cause the processor to perform the adding include instructions to cause the processor to perform encrypting the bit blocks with one or more encryption keys to produce the protected bit blocks as encrypted bit blocks; and
the instructions to cause the processor to perform the replacing include instructions to cause the processor to perform replacing the part of each AM group with the security information to include information identifying the one or more encryption keys.

* * * * *